United States Patent [19]
Hirosue

[11] Patent Number: 5,394,219
[45] Date of Patent: Feb. 28, 1995

[54] EXPOSURE APPARATUS AND METHOD OF EXPOSURE USING THE SAME

[75] Inventor: Miyuki Hirosue, Hyogo, Japan

[73] Assignee: Mitsubishi Denki Kabushiki Kaisha, Tokyo, Japan

[21] Appl. No.: 55,002

[22] Filed: Apr. 30, 1993

[30] Foreign Application Priority Data

May 15, 1992 [JP] Japan .................... 4-123746

[51] Int. Cl.⁶ .................................. G03B 27/32
[52] U.S. Cl. ................................. 355/77; 430/5; 430/30
[58] Field of Search ............ 355/77, 53, 43, 45; 430/30, 5

[56] References Cited

U.S. PATENT DOCUMENTS 4,637,714 1/1987 Flamholz .................... 355/77

FOREIGN PATENT DOCUMENTS 63-274131 11/1988 Japan .

*Primary Examiner*—Steve Rosasco
*Attorney, Agent, or Firm*—Lowe, Price, LeBlanc & Becker

[57] ABSTRACT

A first window portion is provided in a predetermined portion on a substrate where pellicle films of a photomask are not provided, and a second window portion is provided in a predetermined portion on substrate where pellicle films of the photomask are provided. By comparing amounts of exposure luminous flux transmitting first and second window portions it is possible to determine the life of pellicle films and the life of an exposure light source.

3 Claims, 5 Drawing Sheets

→ A DIRECTION

EXPOSURE APPARATUS AND METHOD OF EXPOSURE USING THE SAME

BACKGROUND OF THE INVENTION

1. Field of the Invention

The present invention relates generally to exposure apparatuses, and more particularly, to an exposure apparatus used in manufacturing a semiconductor device and a method of exposure using the exposure apparatus.

2. Description of the Background Art

Recently, photolithography is an indispensable technology in manufacturing semiconductor devices.

With semiconductor devices miniaturized, an exposure apparatus of higher accuracy has been required. As for an example of a conventional exposure apparatus, description will be given to a technology disclosed in Japanese Patent Laying-Open No. 63-274131 hereinafter.

Referring to FIGS. 5 and 6, description will be given to the structure of a photomask 101 with pellicle having a pellicle provided serving as an anti-particle film based on a conventional technique. FIG. 5 is a plan view of photomask 101 with pellicle. FIG. 6 is a cross section taken along the line X—X in FIG. 5. Photomask 101 with pellicle has a pattern 115 of a predetermined shape formed on the surface, opposite to the surface for receiving exposure light, of a substrate 111 of glass or the like. Pellicle films 113, 114 generally include nitrocellulose as the main constituent. Pellicle film 113 is attached to an upper side film frame 116 and a lower side film frame 117. Upper side film frame 116 and lower side film frame 117 are attached to substrate 111. A distance $h_1$ from pellicle film 113 on the upper side to the surface of the substrate is set to approximately 4.0 mm. A distance $h_2$ from pellicle film 114 on the lower side to the surface of the substrate is set to approximately 6.3 mm.

Even if a foreign matter Z having a diameter of approximately 50μm attaches onto pellicle film 114, the shadow of the foreign matter Z in exposure is defocused on the semiconductor substrate. Therefore, it is possible to carry out exposure without affecting transfer to the semiconductor substrate.

A window portion 118 for measuring an amount of exposure is provided in a predetermined portion of substrate 111 in a region enclosed by pellicle films of photomask 101 with pellicle.

Description will now be given to an exposure apparatus 100 including photomask 101 with pellicle.

Referring to FIG. 7, exposure apparatus 100 includes a mask stage 102, a mask loader 103, an exposure light source 106, a projection optical system 107, a wafer stage 105 and a scanning carriage 109. Photomask 101 with pellicle is disposed between exposure light source 106 and projection optical system 107. A semiconductor wafer 104 is disposed on wafer stage 105.

Referring to FIG. 8, description will be given to a first operation of exposure apparatus 100. First, instruction to load photomask 101 with pellicle is given from a controller (not shown) provided in exposure apparatus 100. Before setting photomask 101 with pellicle on mask stage 102, scanning carriage 109 is moved in a direction of an arrow A shown in the figure. Then, exposure luminous flux 108 is directed from exposure light source 106. Exposure luminous flux 108 is focused on a light receiving element 110 for measuring an amount of exposure set at the same height as the surface of semiconductor wafer 104. The amount of exposure at this time is measured by light receiving element 110 for measuring an amount of exposure. The amount of exposure when photomask 101 with pellicle is not provided is stored as "A".

Referring to FIG. 9, description will be given to a second operation of exposure apparatus 100. Photomask 101 with pellicle is set on mask stage 102. Then exposure luminous flux 108 is directed from exposure light source 106. Exposure luminous flux 108 is first focused on photomask 101 with pellicle. Window portion 118 for measuring an amount of exposure is provided with photomask 101 with pellicle in a position corresponding to light receiving element 110 for measuring an amount of exposure. Therefore, exposure luminous flux 108 transmits window portion 118 for measuring an amount of exposure to be focused on light receiving element 110 for measuring an amount of exposure. The amount of exposure at this time is stored as an amount of exposure "B" when exposure luminous flux 108 transmits photomask 101 with pellicle.

The value of a ratio B/A (where A is the amount of exposure when exposure luminous flux 108 does not transmit photomask 101 with pellicle and B is the amount of exposure when exposure luminous flux 108 transmits photomask 101 with pellicle is indicated as transmittance T of the pellicle.

When the transmittance T is lower than a predetermined $T_c$, it is possible to inform the user of the pellicle film life.

However, in the above-described conventional technique, the value A measured without a photomask is used for finding the transmittance T. Therefore, decrease of exposure light caused by the glass substrate is ignored in the value A.

Furthermore, since the transmittance T is set without considering decrease of the amount of exposure by degradation of the exposure light source, there is sometimes a problem that even a pellicle film which can be still usable must be changed for another one.

SUMMARY OF THE INVENTION

One object of the present invention is to provide an exposure apparatus which makes it possible to use a pellicle film efficiently by considering degradation of an exposure light source.

Another object of the present invention is to provide a method of exposure by an exposure apparatus having the step of measuring degradation of an exposure light source and degradation of a photomask.

The exposure apparatus according to the present invention includes exposing means having an exposure light source emitting exposure luminous flux, a photomask having a predetermined transmission pattern provided on a substrate, and having an anti-particle film in a predetermined portion on the substrate, a first window portion provided in a predetermined portion on the substrate where the anti-particle film of the photomask is not provided, a second window portion provided in a predetermined portion on the substrate where the anti-particle film of the photomask is provided, means for measuring each of amounts of exposure of exposure luminous flux transmitting the first window portion, and the second window portion individually.

The method of exposure by using the exposure apparatus according to the present invention includes the following steps. First, the exposure luminous flux is emitted by an exposure light source. Then a predetermined transmission pattern is provided on a substrate, and the exposure luminous flux is transmitted to a photomask having an anti-particle film in a predetermined portion on the substrate. Then, a first amount of exposure is measured of the exposure luminous flux transmitting a first window portion provided in a predetermined portion on the substrate where the anti-particle film of the photomask is not provided is measured. A second amount of exposure is measured of the exposure luminous flux transmitting a second window portion provided in a predetermined portion on the substrate where the anti-particle film of the photomask is provided. By comparing the first and second amounts of exposure with a predetermined reference amount of exposure, degradation of the exposure light source and degradation of the photomask are measured.

According to the exposure apparatus and the method of exposure using the exposure apparatus, degradation of the exposure light source and degradation of the anti-particle film are measured by comparing the amount of exposure of the exposure luminous flux transmitting to the photomask when the anti-particle film is not provided with the amount of exposure of the exposure luminous flux transmitting the photomask when the anti-particle film is provided. As a result, it is possible to optimize the exposure time in accordance with degradation of the anti-particle film and the exposure light source, and to use the exposure light source and the anti-particle film efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given to one embodiment of the exposure apparatus according to the present invention.

Figure 1:
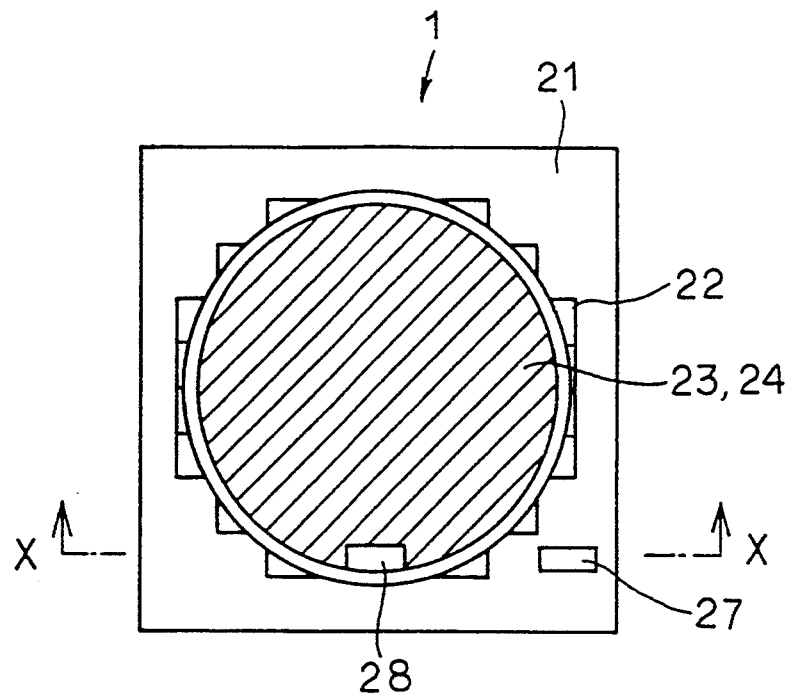
FIG. 1 is a plan view of a photomask with pellicle used in the exposure apparatus according to the present invention.
Figure 2:
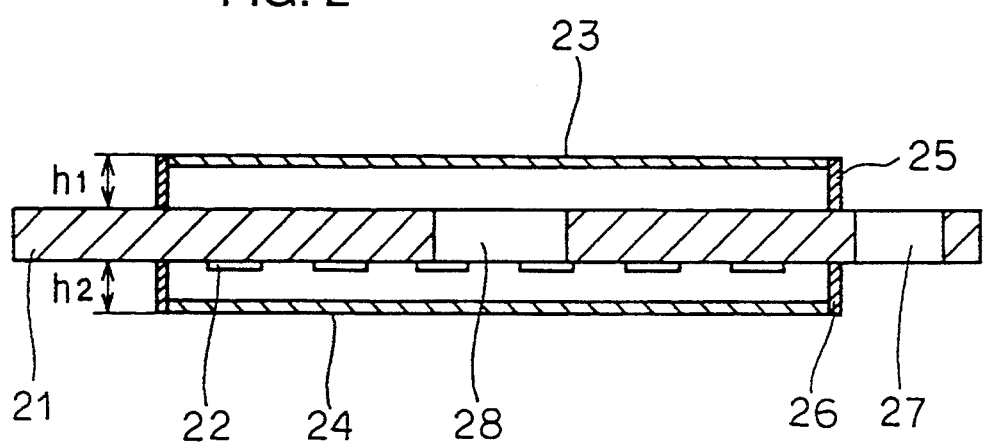
FIG. 2 is a cross section taken along the line X—X in FIG. 1.

FIG. 1 is a plan view of a photomask 1 with pellicle used in an exposure apparatus 50. FIG. 2 is a cross section taken along the line X—X in FIG. 1.

Photomask 1 with pellicle has a pattern 22 of a predetermined shape formed on a surface, opposite to a surface receiving exposure light, of a substrate 21 of glass or the like. The main constituent of pellicle films 23, 24 is generally nitrocellulose. Pellicle films 23, 24 are attached to an upper side film frame 25 and a lower side film frame 26. Upper side film frame 25 and lower side film frame 26 are attached to substrate 21. The distance $h_1$ from pellicle 23 on the upper side to substrate 21 is set to approximately 4.0 mm, while the distance $h_2$ from pellicle film 24 on the lower side to substrate 21 is set to approximately 6.3 mm.

Even if a foreign matter attaches to pellicle film 24 on the side of the patterned surface, the shadow of foreign matter Z is defocused on the semiconductor substrate in exposure. Therefore, it is possible to carry out exposure without affecting transfer to the semiconductor substrate. A first window portion 27 which is not covered with shielding substance such as a pattern for measuring an amount of exposure when exposure luminous flux transmits substrate 21 is provided on a region of substrate 21 which is not covered with pellicle films 23, 24. A second window portion 28 which is not covered with shielding substance such as a pattern for measuring an amount of exposure when exposure luminous flux transmits pellicle films 23, 24 and substrate 21 is further provided on a region of substrate 21 which is surrounded by pellicle films 23, 24.

Figure 3:
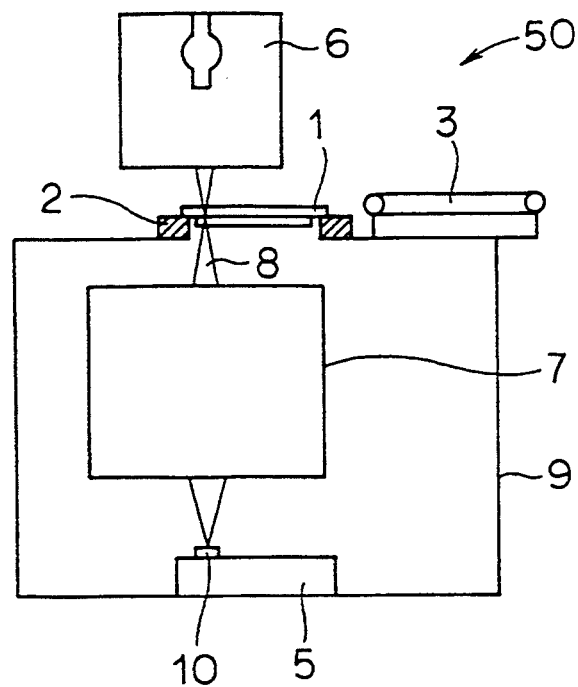
FIG. 3 is a schematic diagram showing the structure of the exposure apparatus according to the present invention.

Referring to FIG. 3, the structure of exposure apparatus 50 using photomask 1 with pellicle will now be described. Exposure apparatus 50 includes photomask 1 with pellicle, mask stage 2, mask loader 3, exposure light source 6, projection optical system 7, wafer stage 5 and scanning carriage 9. Photomask 1 with pellicle is disposed between exposure light source 6 and projection optical system 7. A semiconductor wafer 4 is disposed on wafer stage 5.

A first operation of exposure apparatus 50 will now be described. Instruction to load photomask 1 with pellicle is given by a controller (not shown) provided in exposure apparatus 50. Exposure luminous flux 8 emitted from exposure light source 6 transmits first window portion 27 provided in photomask 1 with pellicle. Exposure luminous flux 8 is focused on light receiving element 10 for measuring an amount of exposure set at the same height as semiconductor wafer 4. The amount of exposure at this time is measured by light receiving element 10 for measuring an amount of exposure, and the amount of exposure when a pellicle film is not provided is stored as "D". Then, scanning carriage 9 is moved by a predetermined distance, and photomask 1 with pellicle is moved so that exposure luminous flux 8 from exposure light source 6 transmits second window portion 28 provided in photomask 1 with pellicle. Then, the amount of exposure is measured by light receiving element 10 for measuring an amount of exposure, and the amount of exposure when a pellicle film is provided is stored as "E".

Figure 4:
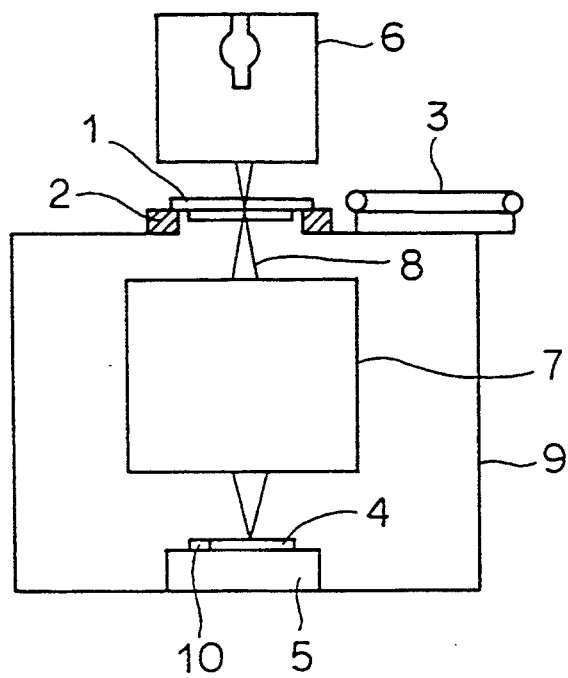
FIG. 4 is a schematic diagram showing the state of exposure of the exposure apparatus according to the present invention.
Figure 5:
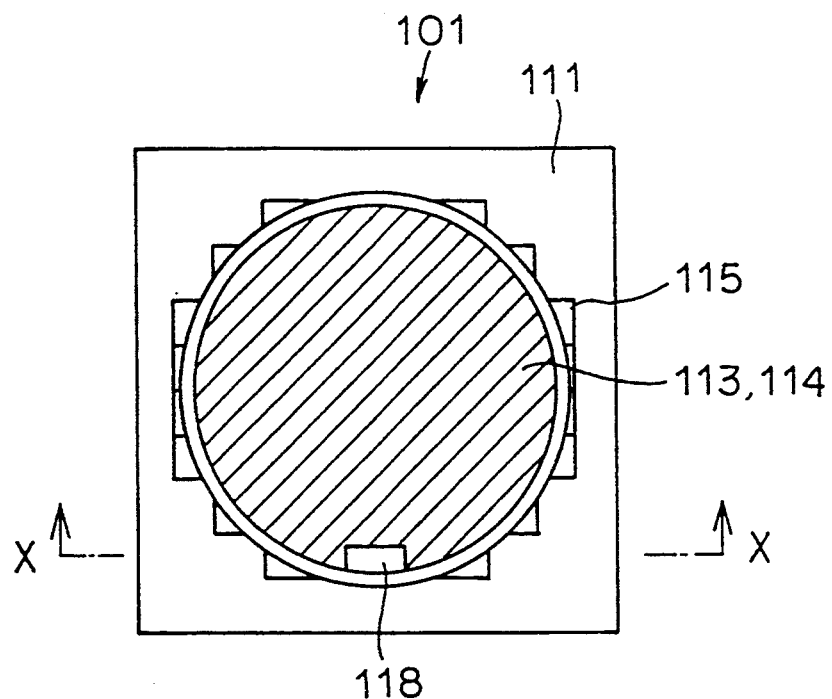
FIG. 5 is a plan view of a photomask with pellicle used in a conventional exposure apparatus.
Figure 6:
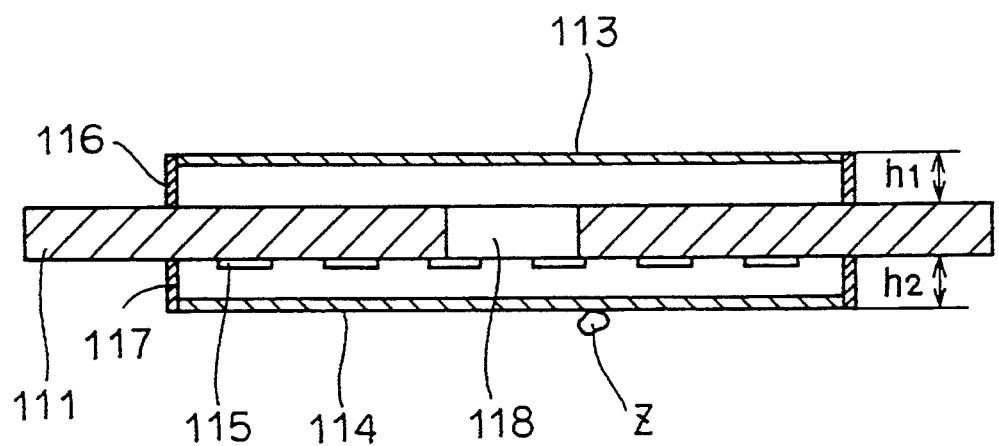
FIG. 6 is a cross section taken along the line X—X in FIG. 5.
Figure 7:
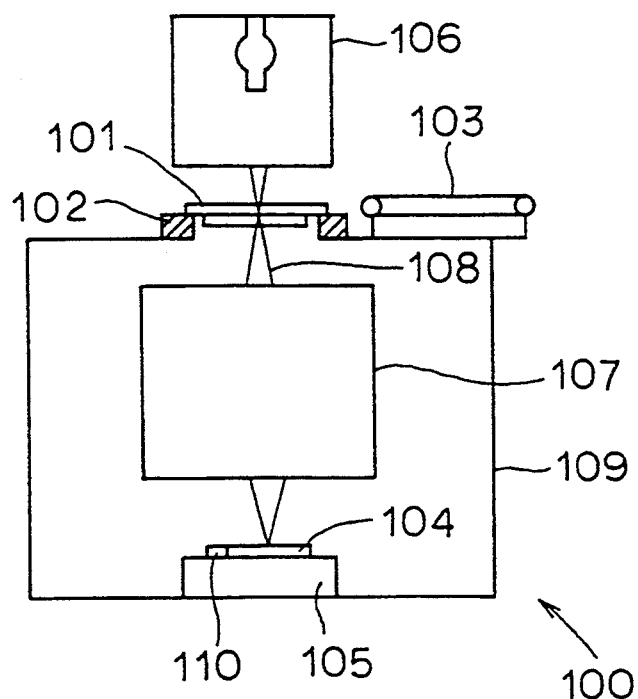
FIG. 7 is a schematic diagram showing the structure of the conventional exposure apparatus.
Figure 8:
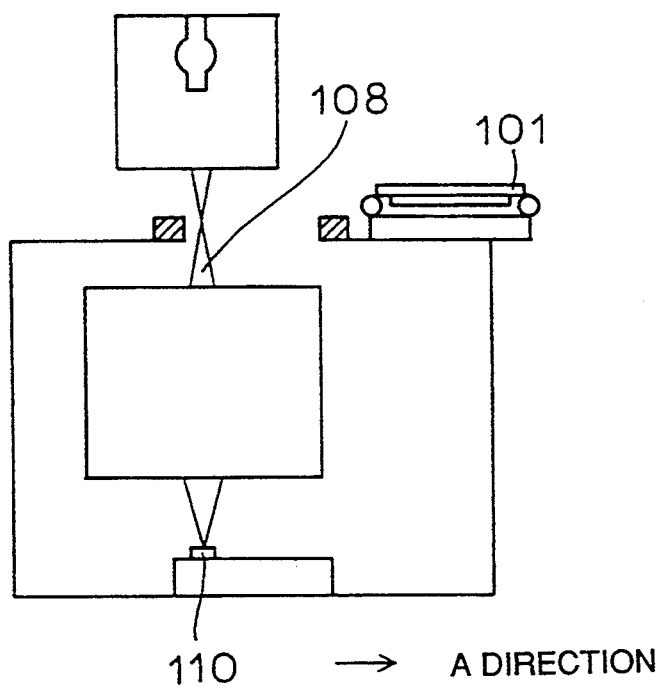
FIG. 8 is a schematic diagram showing a first state of the conventional exposure apparatus.
Figure 9:
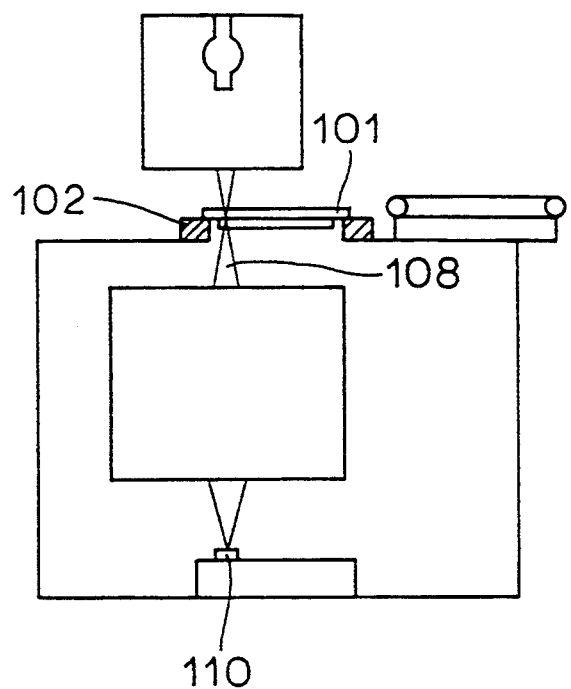
FIG. 9 is a schematic diagram showing a second state of the conventional exposure apparatus.

Referring to FIG. 4, a second operation of exposure apparatus 50 will now be described. Semiconductor wafer 4 is disposed on wafer stage 5. Then semiconductor wafer 4 is subjected to a predetermined patterning with exposure light source 6. After a predetermined time, the amount of exposure of exposure luminous flux 8 transmitting first window portion 27 is again measured by scanning carriage 9, and the value is stored as "D'". Then the amount of exposure of exposure luminous flux 8 transmitting second window portion 28 is measured, and the value is stored as "E'".

Assuming that $D-D'=D_1$, and $E-E'=E_1$, $D_1$ represents degradation of exposure light source 6, while $E_1$ represents degradation of exposure light source 6 and pellicle films 23, 24.

Assuming that $E_1 - D_1 = P$, P represents degradation of only pellicle films 23, 24.

It is possible to know degradation $D_1$ of exposure light source 6 and degradation P of pellicle films 23, 24 by measuring the amount of exposure of exposure luminous flux transmitting first window portion 27 and second window portion 28 at intervals of a predetermined time. Letting $D_E$ and $P_E$ represent the limits of degradation of the exposure light source and the pellicle film, respectively, when degradation $D_1$ of the exposure light source approaches to $D_E$, the exposure time may be adjusted so that the amount of exposure is optimized. When $D_1 \geq D_E$, the exposure light source may be exchanged for a new one.

When the value of degradation $P_1$ of the pellicle film approaches to $P_E$, the exposure time may be adjusted so that the amount of exposure is optimized, and when $P_1 \geq P_E$, the pellicle film may be exchanged for a new one.

As described above, according to the embodiment of the present invention, it is possible to determine the degree of degradation of the exposure light source and the pellicle film are degraded. As a result, it is possible to reduce substantially the cost of exchange of pellicle films. Therefore, it is possible to enhance accuracy of the pattern formed on the semiconductor wafer.

According to the exposure apparatus and the method of exposure using the exposure apparatus based on the present invention, degradation of the exposure light source and the anti-particle film is measured by comparing the amount of exposure of the exposure luminous flux transmitting the photomask when the anti-particle film is not provided, with the amount of exposure of the exposure luminous flux transmitting the photomask where the anti-particle film is provided. This makes it possible to optimize the exposure time in accordance with degradation of the anti-particle film and the exposure light source, and it is also possible to use efficiently the exposure light source and the anti-particle film. As a result, the cost of exchange of anti-particle films can be substantially reduced. It is also possible to manufacture semiconductor devices of higher quality by always optimizing exposure to the semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure apparatus, comprising:
   exposing means having an exposure light source emitting exposure luminous flux;
   a photomask having a predetermined pattern provided on a substrate and having an anti-particle film in a predetermined portion on the substrate;
   a first window portion provided in a predetermined portion on said substrate where said anti-particle of said photomask is not provided;
   a second window portion provided in a predetermined portion on said substrate where said anti-particle film of said photomask is provided; and
   means for measuring each amount of exposure of exposure luminous flux transmitting said first window portion and said second window portion, individually.

2. The exposure apparatus as recited in claim 1, wherein
   said first window portion and said second window portion are provided in a region on said substrate having no shielding substance.

3. The exposure apparatus as recited in claim 1, wherein
   said means for measuring the amount of exposure includes a light receiving element.

* * * * *